United States Patent [19]

Narahara

[11] Patent Number: 5,416,445
[45] Date of Patent: May 16, 1995

[54] LOW POWER-CONSUMPTION CLOCK PULSE GENERATOR WITH TWO CLOCK SOURCES SELECTIVELY AVAILABLE

[75] Inventor: Tetsuya Narahara, Tokyo, Japan

[73] Assignee: NEC Corporation, Tokyo, Japan

[21] Appl. No.: 283,944

[22] Filed: Aug. 1, 1994

[30] Foreign Application Priority Data

Aug. 2, 1993 [JP] Japan .................................. 5-191045

[51] Int. Cl.$^6$ .............................................. H03B 5/36
[52] U.S. Cl. ........................................ 331/49; 331/59; 331/116 FE
[58] Field of Search ............... 331/116 R, 116 FE, 59, 331/158, 172, 173, 49

[56] References Cited

U.S. PATENT DOCUMENTS

| | | | |
|---|---|---|---|
| 3,790,881 | 2/1974 | Smith | 328/112 |
| 4,196,404 | 4/1980 | Ebihara | 331/116 FE |
| 4,871,982 | 10/1989 | Williams et al. | 331/116 FE |
| 5,369,377 | 11/1994 | Benhamida | 331/49 |

*Primary Examiner*—Siegfried H. Grimm
*Attorney, Agent, or Firm*—Whitham, Curtis, Whitham & McGinn

[57] ABSTRACT

A clock pulse generator has a three-state inverter and a transfer gate forming in combination a feedback loop for oscillating an output clock signal in cooperation with a quartz resonator in an internal oscillation mode, and the three-state inverter enters into high-impedance state in an external oscillation mode so that an external clock signal is transferred to the output node of the three-state inverter without malfunction.

11 Claims, 6 Drawing Sheets

LOW POWER-CONSUMPTION CLOCK PULSE GENERATOR WITH TWO CLOCK SOURCES SELECTIVELY AVAILABLE

FIELD OF THE INVENTION

This invention relates to a clock pulse generator and, more particularly, to a low power-consumption clock pulse generator for producing a clock signal from one of the internal and external clock sources.

DESCRIPTION OF THE RELATED ART

Figure 1:
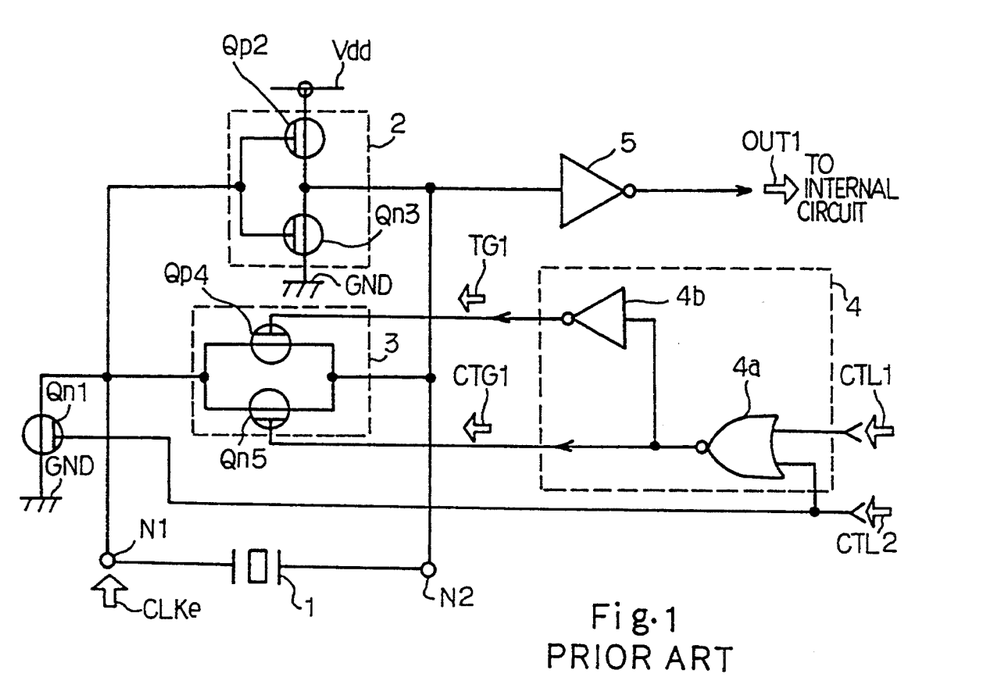
FIG. 1 is a circuit diagram showing the arrangement of the prior art clock pulse generator.

A typical example of the clock pulse generator is illustrated in FIG. 1 of the drawings, and largely comprises a quartz resonator coupled between nodes N1 and N2, an inverter 2 coupled between a positive power voltage line Vdd and a ground voltage line GND and responsive to the potential level at the node N1 for producing the inverted potential level at the node N2, a transfer gate 3 coupled between the nodes N1 and N2, an n-channel enhancement type discharging transistor Qn1 coupled between the node N1 and the ground voltage line GND, a controller 4 responsive to a control signal CTL1 for controlling the transfer gate 3 and an output inverter 5 coupled to the node N2 for producing an output clock signal OUT1. Two control signals CTL1 and CTL2 are supplied to the controller 4, and the control signal CTL2 is further supplied to the n-channel enhancement type discharging transistor Qn1. The control signal CTL1 is indicative of selection between the quartz resonator 1 and an external clock signal CLKe, and the other control signal CTL2 forcibly disables the prior art clock pulse generator. Though not shown in FIG. 1, the control signal CTL1 is supplied from an external controlling circuit such as a microprocessor.

A series combination of p-channel enhancement type switching transistor Qp2 and an n-channel enhancement type switching transistor Qn3 serves as the inverter 2, and the potential level at the node N1 causes the p-channel enhancement type switching transistor Qp2 and the n-channel enhancement type switching transistor Qn3 to complementarily turn on and off.

The transfer gate 3 is implemented by a parallel combination of a p-channel enhancement type transfer transistor Qp4 and an n-channel enhancement type transfer transistor Qn5, and a gate control signal TG1 and the complementary gate control signal CTG1 cause the p-channel enhancement type transfer transistor Qp4 and the n-channel enhancement type transfer transistor Qn5 to concurrently turn on for coupling the output node of the inverter 2 to the input node thereof.

The n-channel enhancement type discharging transistor Qn1 is coupled between the node N1 and the ground voltage line GND, and the control signal CTL2 is supplied to the gate electrode of the n-channel enhancement type discharging transistor Qn1. For this reason, while the control signal CTL2 remains in a high potential level, the n-channel enhancement type discharging transistor Qn1 is turned on, and the inverter 2 is forcibly disabled. On the other hand, if the control signal CTL2 is changed to a low potential level, the n-channel enhancement type discharging transistor Qn1 turns off, and the inverter 2 becomes ready for operation.

The controller 4 comprises a NOR gate 4a and an inverter 4b. The NOR gate 4a is enabled with the control signal CTL2 of the low potential level, and responds to the control signal CTL1 of the low potential level indicative of the output clock signal OUT1 for producing the complementary gate control signal CTG1, and the inverter 4b in turn produces the gate control signal TG1 from the complementary gate control signal CTG1. The gate control signal TG1 of the active low potential level and the complementary gate control signal CTG1 are respectively supplied to the gate electrode of the p-channel enhancement type transfer transistor Qp4 and the gate electrode of the n-channel enhancement type transfer transistor Qn5, and causes the transfer gate 3 to turn on.

Thus, the control signals CTL1 and CTL2 of the low potential level allow the prior art clock pulse generator to activate for producing the output clock signal OUT1. On the other hand, the control signal CTL2 of the high potential level disables the prior art clock pulse generator regardless of the other control signal CTL1. The clock signal CTL1 of the high potential level selects the external clock signal CLKe, and the control signal CTL2 of the low potential level and the control signal CTL1 of the high potential level cause the prior art clock pulse generator to produce the output clock signal OUT1 from the external clock signal CLKe. The output clock signal OUT1 thus produced from the external clock signal CLKe is supplied through the inverter 5 to an internal circuit (not shown).

Figure 2:
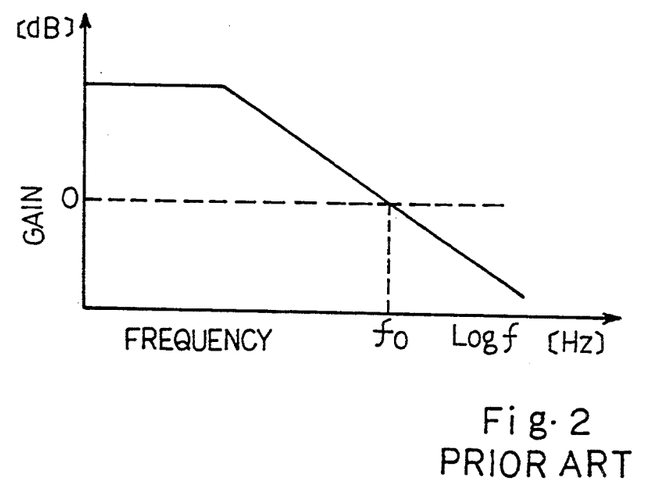
FIG. 2 is a graph showing the frequency-to-gain characteristics of the inverter incorporated in the prior art clock pulse generator.
Figure 3:
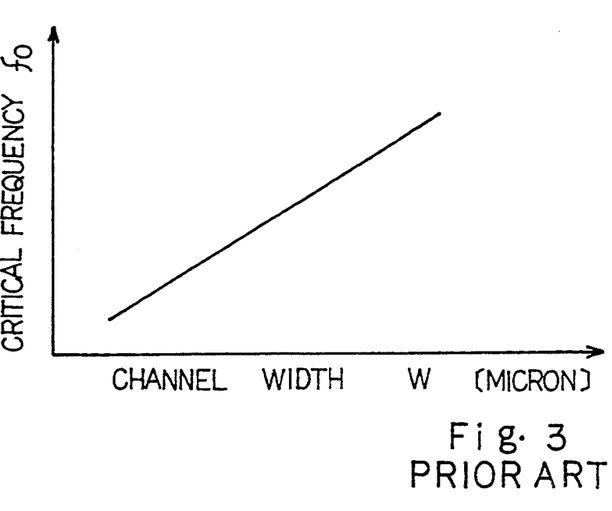
FIG. 3 is a graph showing the critical frequency of the inverter in terms of the channel width of the component transistors.

The frequency-to-gain characteristics of the inverter 2 are illustrated in FIG. 2, and the gain is zero at critical frequency $f_0$. The inverter 2 is stably operable below the critical frequency $f_0$, and the critical frequency is generally in proportion to the channel width W of the component transistors Qp2 and Qn3 as shown in FIG. 3. For this reason, even if the clock pulse generator is expected to oscillate at a certain frequency, an oversized p-channel enhancement type switching transistor Qp2 and an oversized n-channel enhancement type switching transistor Qn3 are required for the inverter 2.

Figure 4:
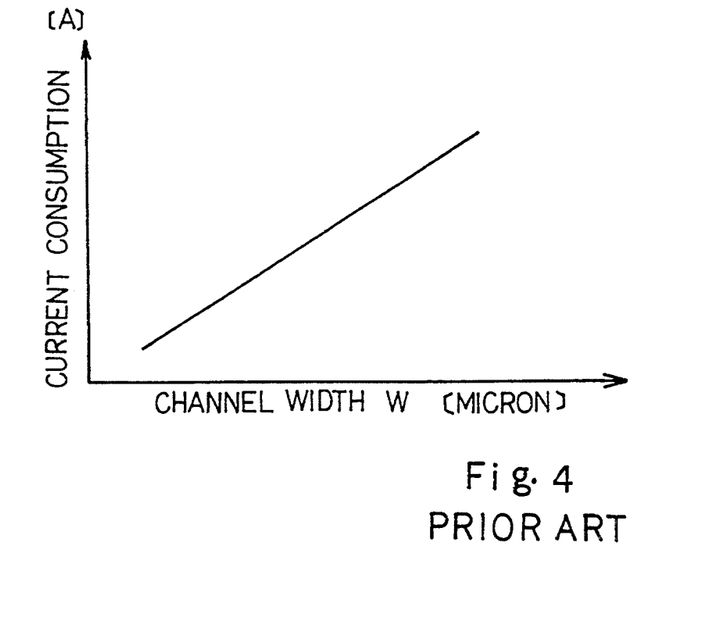
FIG. 4 is a graph showing the current consumption of the inverter in terms of the channel width of the component transistors.

The current consumption of the inverter 2 is generally proportional to the channel width W of the component transistors Qp2 and Qn3 as shown in FIG. 4, and is regardless of the frequency. The requirement for the stable oscillation results in a substantial amount of current consumption.

Figure 5:
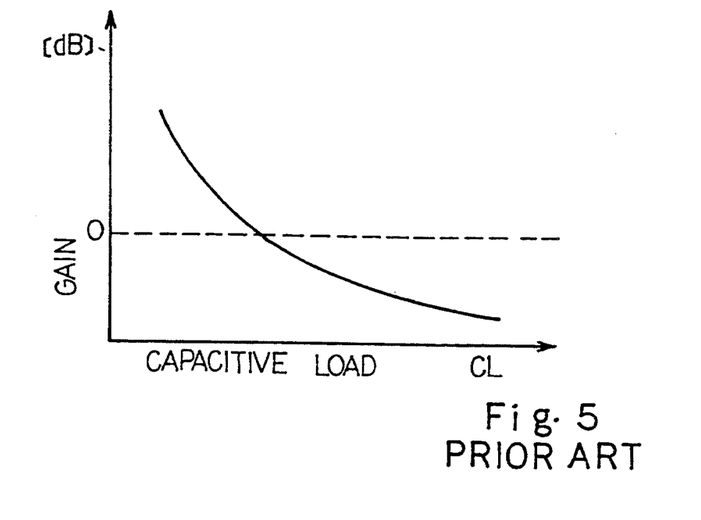
FIG. 5 is a graph showing the capacitance-to-gain characteristics of the inverter.

As described hereinbefore, if the control signal CTL1 is indicative of the external clock signal CLKe applied to the node N1, the transfer gate 3 is turned off, and the inverter 2 drives the capacitive load CL coupled to the output node thereof. The gain of the inverter 2 is variable with the capacitive load CL as shown in FIG. 5, and a large capacitive load CL deteriorates the current driving capability of the inverter 2.

If the prior art clock pulse generator is integrated on a semiconductor chip together with the internal circuits, an external wiring is usually coupled to the node N2, and the parasitic capacitance of the external wiring is not ignoreable. In other words, the inverter 2 is expected to the drive a large amount of capacitive load CL, and the gain becomes smaller. As a result, the output inverter 5 tends to hardly relay the clock signal to the internal circuit. This is the problem encountered in the prior art clock pulse generator under the application of the external clock signal CLKe to the node N1.

In order to prevent the prior art clock pulse generator from the malfunction, the external clock signal CLKe may be supplied to the node N2 instead of the node N1. However, while the external clock signal CLKe is being supplied to the node N2, the gate-todrain voltages of the transistors Qp2 and Qn3 are affected by the external clock signal CLKe, and a through-current is liable to flow through the inverter 2. The through-current deteriorates the current consumption of the prior art clock pulse generator. As described hereinbefore, the oversized component transistors Qp2 and Qn3 inherently consume a substantial amount of current for the stability, and the through-current makes the current consumption of the prior art clock pulse generator serious. Moreover, the potential at the output node of the inverter tends to make the external clock signal CLKe smooth, and the output inverter 5 can not produce the output clock signal OUT1. These are the problems inherent in the prior art clock pulse generator under the application of the external clock signal to the opposite node N2.

Figure 6:
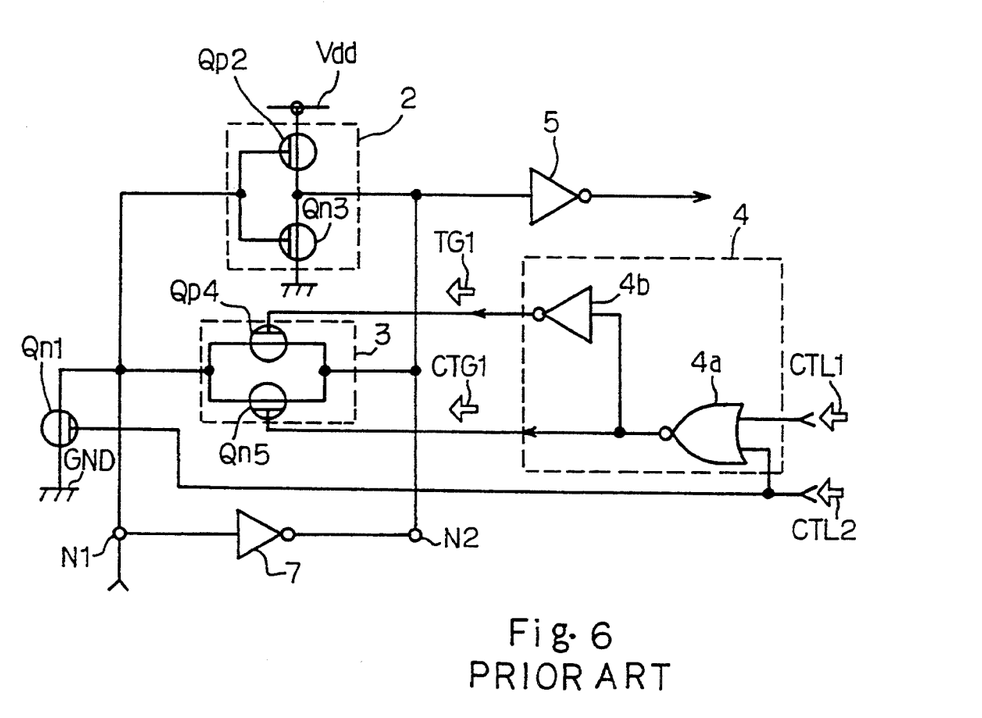
FIG. 6 is a circuit diagram showing the arrangement of the prior art clock pulse generator accompanied with the inverter.

If an inverter 7 is additionally coupled between the node N1 and the other node N2 outside of the semiconductor chip, the inverter complementarily changes the potential levels at the nodes N1 and N2, and the prior art clock pulse generator may become free from the above described problems. However, the inverter 7 is additionally required, and is the problem inherent in the prior art clock pulse generator under the application of the external clock signal between the nodes N1 and N2.

SUMMARY OF THE INVENTION

It is therefore an important object of the present invention to provide a clock pulse generator which is free from the problems inherent in the prior art clock pulse generator.

To accomplish the object, the present invention proposes to isolate an output node of an inverter from both power voltage lines while an external clock signal is being supplied.

In accordance with the present invention, there is provided a clock pulse generator selectively entering into an internal oscillation mode and an external oscillation mode, comprising: a) a controller operative to produce a gate control signal indicative of one of conductive state and isolated state and a state control signal indicative of one of high-impedance state and enabled state; b) a three-state logic gate coupled between first and second sources of power voltage level different in potential level, and having an input port coupled to a first node and an output port coupled to a second node, the three-state logic gate being responsive to the state control signal for selectively entering into the high-impedance state in the external oscillation mode and the enabled state in the internal oscillation mode; c) a transfer circuit coupled between the first node and the second node, and responsive to the gate control signal indicative of the conductive state for forming a feedback loop together with the three-state logic gate in the internal oscillation mode, the transfer circuit being further responsive to the gate control signal indicative of the isolated state for isolating the input port from the output port in the external oscillation mode, an external clock signal being propagated from the second node to the output port in the external oscillation mode; and d) an internal resonator coupled between the first node and the second node in parallel to the transfer circuit so that the feedback loop produces an internal clock signal in cooperation therewith in the internal oscillation mode.

BRIEF DESCRIPTION OF THE DRAWINGS

The features and advantages of the clock pulse generator according to the present invention will be more clearly understood from the following description taken in conjunction with the accompanying drawings in which.

DESCRIPTION OF THE PREFERRED EMBODIMENTS

First Embodiment

Figure 7:
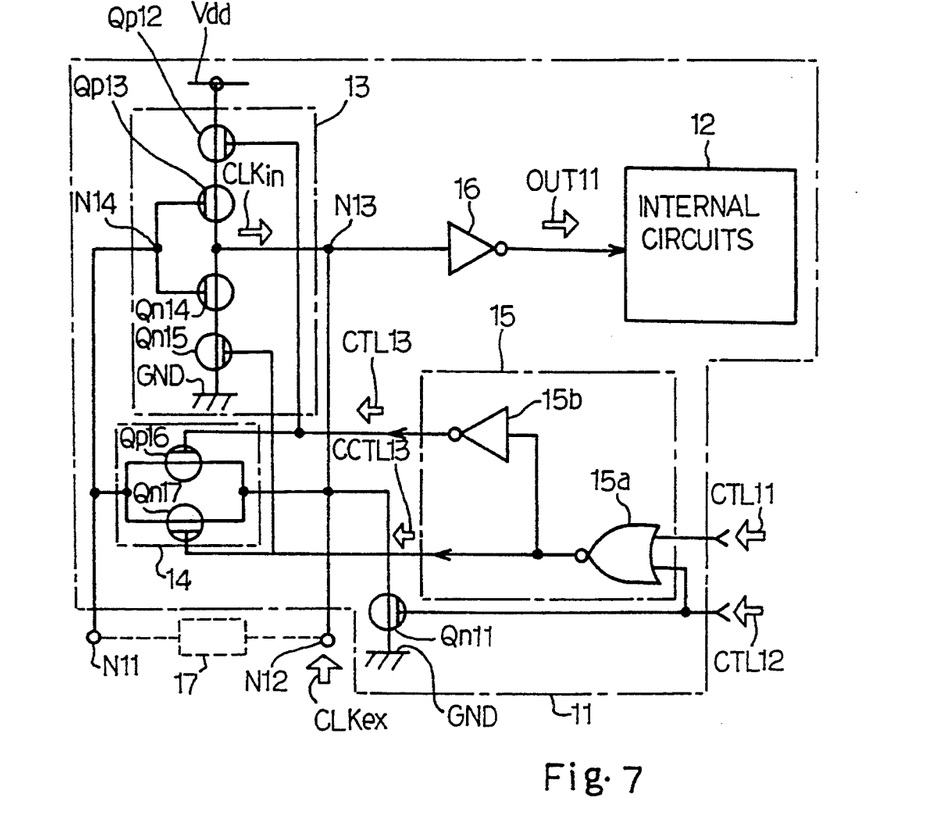
FIG. 7 is a circuit diagram showing the arrangement of a clock pulse generator according to the present invention.

Referring to FIG. 7 of the drawings, a clock pulse generator embodying the present invention is integrated on a single semiconductor chip 11 together with internal circuits 12. The clock pulse generator largely comprises an three-state inverter 13, a transfer gate 14, a controller 15, an output inverter 16, an n-channel enhancement type discharging transistor Qn11 and a quartz oscillator 17, and selectively enters into an internal oscillation mode, an external oscillation mode and a disable mode depending upon control signals CTL11 and CTL12 supplied from an external central processing unit (not shown). In the followings description, the high potential level and the low potential level are assumed to be logic "1" level and logic "0" level, respectively.

The three-state inverter 13 and the transfer gate 14 are coupled in parallel between a first node N11 and a second node N12, and form in combination a feedback loop under the control of the controller 15 in the internal oscillation mode. In the internal oscillation mode, the quartz resonator 17 and the feedback loop cooperate, and produce an internal clock signal CLKin at an output node N13 of the three-state inverter 13. On the other hand, if the transfer gate 14 electrically isolates the first node N11 from the second node N12 in the external oscillation mode, an external clock signal CLKex is propagated from the second node N12 to the output node N13 of the three-state inverter 13.

The control circuit 15 comprises a NOR gate 15a and an inverter 15b, and is enabled with the control signal CTL12 for changing an internal control signal CTL13 and the complementary signal CCTL13 thereof. In detail, the control signal CTL12 of a high potential level is indicative of the disable state, and is changed to a low potential level in the internal and external oscillation modes. The control signal CTL12 is supplied to one of the two input nodes of the NOR gate 15a and the gate electrode of the n-channel enhancement type discharging transistor Qn11. The control signal CTL12 of the high potential level causes the NOR gate 15a to fix the complementary signal CCTL13 to the low potential level regardless of the control signal CTL11, and the inverter 15b fixes the internal control signal CTL13 to the high potential level. On the other hand, while the control signal CTL12 is staying in the low potential level, the NOR gate 15a is responsive to the other control signal CTL11, and the NOR gate 15a and the inverter 15b change the internal control signal CTL13 and the complementary signal CCTL13 depending upon the control signal CTL11. In this instance, the internal control signal CTL13 of the low potential level is indicative of the internal oscillation mode, and the internal control signal CTL13 of the high potential level is indicative of the external oscillation mode.

The n-channel enhancement type discharging transistor Qn11 is coupled between the node N12 and a ground voltage line GND, and the control signal CTL12 is supplied to the gate electrode of the n-channel enhancement type discharging transistor Qn11. The n-channel enhancement type discharging transistor Qn11 turns on in the presence of the control signal CTL12 of the high potential level, and forcibly pulls down the output node N13 to the ground voltage level. For this reason, the clock pulse generator does not supply the output clock signal OUT11 to the internal circuits in the disable mode. On the other hand, the control signal CTL12 of the low potential level maintains the n-channel enhancement type discharging transistor Qn11 in the off-state, and the clock pulse generator produces the output clock signal OUT11 from one of the internal clock signal CLKin and the external clock signal CLKex.

The three-state inverter 13 comprises p-channel enhancement type switching transistors Qp12 and Qp13 and n-channel enhancement type switching transistors Qn14 and Qn15 coupled in series between a power voltage line Vdd and the ground voltage line GND. The input node N14 is coupled to the gate electrode of the p-channel enhancement type switching transistor Qp13 and the gate electrode of the n-channel enhancement type switching transistor Qn14, and the p-channel enhancement type switching transistor Qp13 and the n-channel enhancement type switching transistor Qn14 complementarily turn on and off depending upon the potential level at the input node N14.

The internal control signal CTL13 and the complementary signal CCTL13 are respectively supplied to the gate electrode of the p-channel enhancement type switching transistor Qp12 and the gate electrode of the n-channel enhancement type switching transistor Qn15, and concurrently turn on and off depending upon the potential level of the control signal CTL11. Namely, while the control signal CTL11 remains in the low potential level indicative of the internal oscillation mode, the internal control signal CTL13 and the complementary signal CCTL13 thereof maintain the p-channel enhancement type switching transistor Qp12 and the n-channel enhancement type switching transistor Qn15 in the on-state, and the three-state inverter 13 becomes responsive to the potential level at the input node N14.

On the other hand, if the control signal CTL11 is changed to the high potential level indicative of the external oscillation mode, the internal control signal CTL13 and the complementary signal CCTL13 cause the p-channel enhancement type switching transistor Qp12 and the n-channel enhancement type switching transistor Qn15 to turn off, and the three-state inverter 13 enters into the high-impedance state. Thus, the internal control signal CTL13 and the complementary signal CCTL13 supplied to the three-state inverter 13 serve as a state control signal.

Although the p-channel enhancement type switching transistor Qp12 and the n-channel enhancement type switching transistor Qn15 are incorporated in the inverter, the p-channel enhancement type switching transistor Qp12 and the n-channel enhancement type switching transistor Qn15 do not increase the capacitive load of the quartz resonator 17, nor affect the oscillation characteristics of the three-state inverter 13.

The transfer gate 14 is implemented by a parallel combination of a p-channel enhancement type transfer transistor Qp16 and an n-channel enhancement type transfer transistor Qn17 coupled between the nodes N11 and N12, and the internal control signal CTL13 and the complementary signal CCTL13 are supplied to the gate electrode of the p-channel enhancement type transfer transistor Qp16 and the gate electrode of the n-channel enhancement type transfer transistor Qn17, respectively. While the control signal CTL11 remains in the low potential level indicative of the internal oscillation mode, the internal control signal CTL13 and the complementary signal CCTL13 cause the n-channel enhancement type transfer transistor Qn17 and the p-channel enhancement type transfer transistor Qp16 to turn on so that the three-state inverter 13 and the transfer gate 14 form in combination the feedback loop.

On the other hand, if the control signal CTL11 is changed to the high potential level indicative of the external oscillation mode, the internal control signal CTL13 and the complementary signal CCTL13 cause the p-channel enhancement type transfer transistor Qp16 and the n-channel enhancement type transfer transistor Qn17 to turn off, and the first node N11 and, accordingly, the input node N14 are electrically isolated from the second node N12 and the output node N13. Thus, the internal control signal CTL13 and the complementary signal CCTL13 supplied to the transfer gate 14 serve as a gate control signal.

The output inverter 16 has an input node coupled to the output node N13 of the three-state inverter 13, and produces the output clock signal OUT11 from one of the internal clock signal CLKin and the external clock signal CLKex.

The clock pulse generator thus arranged behaves as follows. If the control signal CTL12 remains in the high potential level indicative of the disable mode, the n-channel enhancement type discharging transistor Qn11 forcibly maintains the output node N13 in the low potential level, and the internal control signal CTL13 and the complementary signal CCTL13 disable the three-state inverter 13. Even through a pulse signal is supplied to the first and/or second nodes N11/N12, the output inverter 16 never produces the output clock signal OUT11.

If the control signal CTL12 is changed to the low potential level, the controller 15 becomes responsive to the other control signal CTL11, and changes the internal control signal CTL13 and the complementary signal CCTL13 between the high potential level and the low potential level depending upon the potential level of the control signal CTL11.

If the control signal CTL11 is indicative of the internal oscillation mode, the three-state inverter 13 is enabled, and the transfer gate 14 turns on. The three-state inverter 13 and the transfer gate 14 form in combination the feedback loop, and the feedback loop cooperates with the quartz resonator 17 for producing the internal clock signal CLKin at the output node N13. The output inverter 16 produces the output clock signal OUT11 from the internal clock signal CLKin.

On the other hand, if the control signal CTL11 is indicative of the external oscillation mode, the transfer gate 14 is turned off, and the p-channel enhancement type switching transistor Qp12 and the n-channel enhancement type switching transistor Qn15 keep the three-state inverter 13 in the high-impedance state. The external clock signal CLKex is supplied from the second node N12 through the output node N13 to the output inverter 16, and the output inverter 16 produces the output clock signal OUT11 from the external clock signal CLKex.

Thus, the three-state inverter 13 is not involved in the external oscillation mode, and the malfunction due to the three-state inverter 13 never takes place. Especially, the p-channel enhancement type switching transistor Qp12 and the n-channel enhancement type switching transistor Qn15 perfectly isolate the output node N13 from the power voltage line Vdd and the ground voltage line GND, and, for this reason, a through-current does not flow through the three-state inverter 13. This means that the power consumption is effectively decreased.

While the clock pulse generator is operating in the external oscillation mode, the first node N11 stands idle, and is available for a new purpose.

Second Embodiment

Figure 8:
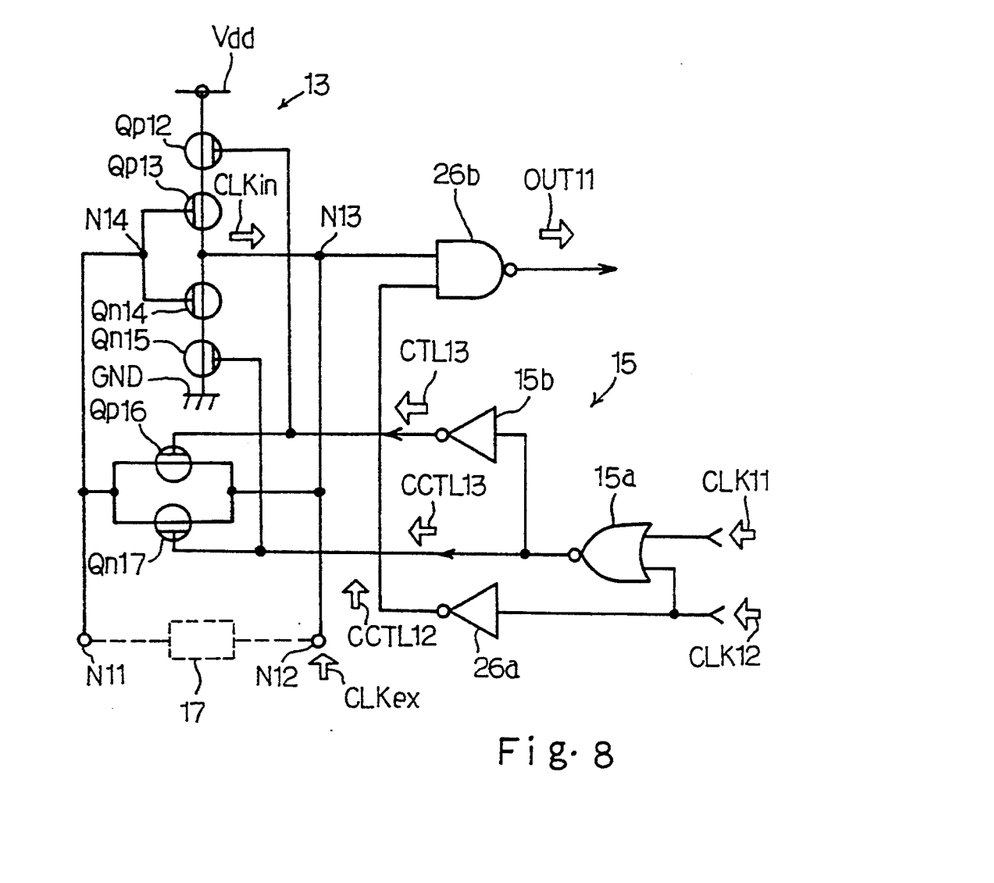
FIG. 8 is a circuit diagram showing the arrangement of another clock pulse generator according to the present invention.

Turning to FIG. 8 of the drawings, another clock pulse generator embodying the present invention is illustrated. The clock pulse generator implementing the second embodiment is similar in arrangement to the first embodiment except for the n-channel enhancement type discharging transistor Qn11, and the n-channel enhancement type discharging transistor Qn11 is replaced with an inverter 26a and a NAND gate 26b. The inverter 26a and the NAND gate 26b as a whole constitute a disabling means instead of the n-channel enhancement type discharging transistor Qn11. For this reason, description is focused on the disabling means 26a and 26b only, and the other components are labeled with the same references as those of the first embodiment.

The control signal CTL12 is supplied to the inverter 26a, and the complementary signal CCTL12 is supplied to the NAND gate 26b for controlling the status of the NAND gate 26b. The output node N13 is coupled to the other input node of the NAND gate 26b, and the NAND gate 26b produces the output clock signal OUT11 from one of the internal clock signal CLKin and the external clock signal CLKex.

While the control signal CTL12 is in the high potential level indicative of the disable mode, the complementary signal CCTL12 disables the NAND gate 26b, and the output clock signal OUT11 is fixed to the high potential level.

On the other hand, if the control signal CTL12 is changed to the low potential level, the complementary signal CCTL12 enables the NAND gate 26b, and the NAND gate 26b produces the output clock signal OUT11 from one of the internal clock signal CLKin and the external clock signal CLKex.

The clock pulse generator thus arranged also keeps the three-state inverter 13 in the high-impedance state in the external oscillation mode, and achieves all of the advantages of the first embodiment.

Although particular embodiments of the present invention have been shown and described, it will be obvious to those skilled in the art that various changes and modifications may be made without departing from the spirit and scope of the present invention. For example, the control signals CTL11 and CTL12 may be supplied from the internal circuits 12 to the clock pulse generator according to the present invention, and the channel conductivities of the component field effect transistors are changeable to the opposite type. Moreover, the three-state inverter 13 is replaceable with another three-state logic gate.

What is claimed is:

1. A clock pulse generator selectively entering into an internal oscillation mode and an external oscillation mode, comprising:
   a) a controller operative to produce a gate control signal indicative of one of conductive state and isolated state and a state control signal indicative of one of high-impedance state and enabled state;
   b) a three-state logic gate coupled between first and second sources of power voltage level different in potential level, and having an input port coupled to a first node and an output port coupled to a second node, said three-state logic gate being responsive to said state control signal for selectively entering into said high-impedance state in said external oscillation mode and said enabled state in said internal oscillation mode;
   c) a transfer circuit coupled between said first node and said second node, and responsive to said gate control signal indicative of said conductive state for forming a feedback loop together with said three-state logic gate in said internal oscillation mode, said transfer circuit being further responsive to said gate control signal indicative of said isolated state for isolating said input port from said output port in said external oscillation mode, an external clock signal being propagated from said second node to said output port in said external oscillation mode; and
   d) an internal resonator coupled between said first node and said second node in parallel to said transfer circuit so that said feedback loop produces an internal clock signal in cooperation therewith in said internal oscillation mode.

2. The clock pulse generator as set forth in claim 1, in which said three-state logic gate changes a potential level at said output port complementary to a potential level at said input port.

3. The clock pulse generator as set forth in claim 2, in which said three-state logic gate has a series of first, second, third and fourth switching transistors coupled between said first and second sources of power voltage level, said first and fourth switching transistors being responsive to said state control signal so as to be concurrently changed between on-state and off-state, said second and third switching transistors being responsive to said potential level at said input port in said enabled state so as to be complementarily changed between on-state and off-state for transferring the potential level at one of said first and second sources of power voltage level to said output port.

4. The clock pulse generator as set forth in claim 1, in which said controller is enabled in said internal oscillation mode and in said external oscillation mode, and is disabled in the presence of a disable signal supplied from the outside of said clock pulse generator.

5. The clock pulse generator as set forth in claim 4, further comprising a disabling means responsive to said disable signal for forcibly disabling said clock pulse generator.

6. The clock pulse generator as set forth in claim 5, in which said disabling means is implemented by a discharging transistor coupled between said second node and one of said first and second sources of power voltage level, said discharging transistor being turned off in the absence of said disable signal, said discharging transistor turning on in the presence of said disable signal.

7. The clock pulse generator as set forth in claim 6, further comprising an output inverter coupled to said output port of said three-state logic gate for producing an output clock signal from one of said internal clock signal and said external clock signal.

8. The clock pulse generator as set forth in claim 5, in which said disabling means is implemented by a logic circuit having an input node coupled to said output port of said three-state logic gate, said logic circuit being disabled in the presence of said disable signal, said logic circuit being enabled in the absence of said disable signal for producing an output clock signal from one of said internal clock signal and said external clock signal.

9. The clock pulse generator as set forth in claim 8, in which said logic circuit has a NAND gate having a first input node coupled to said output port of said three-state logic gate and a second input node and an inverter responsive to said disable signal for supplying the complementary signal of said disable signal to said second input node of said NAND gate.

10. A clock pulse generator selectively entering into an internal oscillation mode, an external oscillation mode and a disable mode, comprising:
a) a controller enabled in said internal oscillation mode and said external oscillation mode, and responsive to an external control signal for producing an internal control signal indicative of one of said internal oscillation mode and said external oscillation mode;
b) a three-state inverter coupled between first and second sources of power voltage level different in potential level, and having an input port coupled to a first node and an output port coupled to a second node, said three-state inverter being responsive to said internal control signal for selectively entering into high-impedance state in said external oscillation mode and enabled state in said internal oscillation mode;
c) a transfer circuit coupled between said first node and said second node, and responsive to said internal control signal indicative of said internal oscillation mode for forming a feedback loop together with said three-state inverter, said transfer circuit being further responsive to said internal control signal indicative of said external oscillation mode for isolating said input port from said output port, an external clock signal being propagated from said second node to said output port in said external oscillation mode;
d) a quartz resonator coupled between said first node and said second node in parallel to said transfer circuit so that said feedback loop produces an internal clock signal in cooperation therewith in said internal oscillation mode;
e) an output inverter having an input node coupled to said output port of said three-state inverter for producing an output clock signal from one of said internal clock signal and said external clock signal; and
f) a discharging transistor coupled between said second node and one of said first and second sources of power voltage level, and responsive to a disable signal indicative of said disable state for forcibly fixing said output port to the power voltage level of said one of said first and second sources.

11. A clock pulse generator selectively entering into an internal oscillation mode, an external oscillation mode and a disable mode, comprising:
a) a controller enabled in said internal oscillation mode and said external oscillation mode, and responsive to an external control signal for producing an internal control signal indicative of one of said internal oscillation mode and said external oscillation mode;
b) a three-state inverter coupled between first and second sources of power voltage level different in potential level, and having an input port coupled to a first node and an output port coupled to a second node, said three-state logic inverter being responsive to said internal control signal for selectively entering into high-impedance state in said external oscillation mode and enabled state in said internal oscillation mode;
c) a transfer circuit coupled between said first node and said second node, and responsive to said internal control signal indicative of said internal oscillation mode for forming a feedback loop together with said three-state inverter, said transfer circuit being further responsive to said internal control signal indicative of said external oscillation mode for isolating said input port from said output port, an external clock signal being propagated from said second node to said output port in said external oscillation mode;
d) a quartz resonator coupled between said first node and said second node in parallel to said transfer circuit so that said feedback loop produces an internal clock signal in cooperation therewith in said internal oscillation mode; and
e) a NAND gate having a first input node coupled to the output port of said three-state inverter and a second input node supplied with a disable signal indicative of said disable state, said NAND gate being enabled in the absence of said disable signal for producing an output clock signal from one of said internal clock signal and said external clock signal, said NAND gate being disabled in the presence of said disable signal for fixing an output node thereof to the power voltage level of one of said first and second sources.

* * * * *